United States Patent
Golla et al.

[19]

[11] Patent Number: 5,815,406
[45] Date of Patent: Sep. 29, 1998

[54] METHOD AND SYSTEM FOR DESIGNING A CIRCUIT USING RC AND TIMING WEIGHTING OF NETS

[75] Inventors: Robert Thaddeus Golla, Plano; Christopher Hans Olson, Austin, both of Tex.

[73] Assignee: International Business Machines Corporation, Armonk, N.Y.

[21] Appl. No.: 620,734

[22] Filed: Mar. 25, 1996

[51] Int. Cl.$^6$ .................................................. G06F 17/00
[52] U.S. Cl. .................. 364/490; 364/488; 364/489; 364/491
[58] Field of Search .................. 364/488–491

[56] References Cited

U.S. PATENT DOCUMENTS

| | | | |
|---|---|---|---|
| 5,461,576 | 10/1995 | Tsay et al. | 364/490 |
| 5,521,837 | 5/1996 | Frankle et al. | 364/491 |
| 5,617,325 | 4/1997 | Schaefer | 364/488 |
| 5,648,913 | 7/1997 | Bennett et al. | 364/491 |
| 5,666,290 | 9/1997 | Li et al. | 364/491 |

OTHER PUBLICATIONS

Tanka et al. "Minimum Delay Placement With Influence of Nets and Hierarchical Clustering,"IEEE, pp. 663–666 1994.

*Primary Examiner*—Emanuel Todd Voeltz
*Assistant Examiner*—Vuthe Siek
*Attorney, Agent, or Firm*—Sawyer & Associates; Casimer K. Salys

[57] ABSTRACT

A timing driven placement system and method for designing an integrated circuit. The inventive method includes the steps of identifying a plurality of nets having blocks of circuit components connected by conductive elements and assigning weights to the nets in proportion to timing and resistive-capacitive (RC) effects therein. In the preferred embodiment, the weights are used by a conventional placement program to obtain the final placements.

5 Claims, 2 Drawing Sheets

METHOD AND SYSTEM FOR DESIGNING A CIRCUIT USING RC AND TIMING WEIGHTING OF NETS

FIELD OF THE INVENTION

The present invention relates to computing systems. More specifically, the present invention relates to systems and techniques for computer aided design of integrated circuitry and the automated physical layout of same.

BACKGROUND OF THE INVENTION

Large scale integrated circuit design requires thousands of circuits and components to be physically placed and connected on a chip. This can be very time consuming, especially given that the actual process of designing, placing, and connecting the circuits on the chip can affect the performance and timing requirements thereof. Therefore, it has become necessary to automate the design process to quickly place and wire predesigned circuits into a functional chip. Automation is typically effected using powerful computers having expensive per hour costs associated therewith.

Accordingly, conventional automation techniques often sacrifice circuit performance for minimal design computing time. When the functional chip being designed is a central processing unit of a computer or other chip in which performance is critical and design complexity high, the performance sacrifice is not acceptable and the automation technique is of limited utility.

This performance sacrifice usually manifests as an inability to obtain timing closure in complicated logic. Timing closure is the difference between the time allowed for processing information on the chip as logically designed and the time required to process information on the chip as physically designed. Hence, timing closure is not met when the chip, as physically wired and placed, is not as fast as required by the logical design.

The sacrifice in performance of prior art automated placement and wire techniques is in two main areas. First, the prior art techniques are mainly concerned with the length of individual wires connecting the individual circuits. CPLACE by IBM is one such placement algorithm. CPLACE attempts to minimize total wire length over a large number of blocks of circuit elements. Unfortunately, CPLACE does not take timing and loads into account.

Second, to the extent that other prior art techniques analyze physical placement effects on timing, they do so by computing those effects from a detailed timing model of the entire circuit. This analysis requires significant computing time which limits the use of the timing model for all circuit placement changes.

Some solutions to the above problems include sensitizing the wiring program to critical logical nets. Critical nets are those circuits within the chip which have relatively more impact on the overall chip performance than do other nets. The sensitization of the wiring program would identify those nets and wire them near the beginning of the program so that they would avoid having to deal with later chip wire congestion and therefore have a greater chance to be as short as possible. This type of sensitization would also include a minimization of the number of maximum crossings of a reference line. The number of crossings would indicate how many bends in the wire which impede circuit performance, therefore, minimizing the number of bends would enhance the chip performance. Although this technique improves performance, it does not address the physical placement of the circuits which created the critical nets.

An alternative approach would be to do a complete timing analysis of the chip after the physical design and identify the critical areas where the physical design added significant delay to critical logical nets. When these areas are found, individual circuits can be rearranged so as to minimize the performance impact. The problem with this is that when the number of circuits gets large or the wiring channels get densely populated the individual changes are difficult and time consuming to make. Also, the number of changes to be made must be limited to reduce the complexity of individual changes and their impact on the design. These difficulties make this design alternative limited because the chips requiring automation typically have large numbers of circuits.

A further alternative design automation approach involves automatically swapping the position of circuits within a chip after it has been wired and recalculating the timing parameters. This procedure leads to inordinate computation time because it is typical to find many paths being affected by an interchange in only two circuits. Therefore, the position swapping is limited in some manner to only those critical paths, physical and logical, which are judged to involve the greatest impact on the circuit. This limitation on which circuits to interchange, limits the effectiveness of the automation procedure. This is because many physical positions of circuits are never evaluated and so the judgment of which circuits to interchange does not take those possibilities into account.

A still further alternative design automation approach involves placing an upper bound on the maximum length of a wire within all the nets of the chip design. While automated wire placement is difficult, it is not more difficult to use an upper bound than it is to minimize the wire lengths. This approach evaluates slack as a means to prioritize which nets require special attention by the wiring program. Slack is the difference between the designed (logical) delay and the actual delay (after added wiring delay) from the wiring program. If slack is positive, the net meets the design criteria and does not get additional program attention. If the slack is negative, the net is re-routed until the net slack becomes positive.

Again, as in other techniques, this program does not account for the placement of the circuits which are to be wired. Therefore, many placement solutions are never considered and accordingly the wiring or performance is not likely to be optimal.

Thus, there has been a need in the art for improved placement techniques. The need in the art was addressed somewhat by U.S. Pat. No. 5,218,551, entitled Timing Driven Placement, issued Jun. 8, 1993 to Agrawal et al., the teachings of which are incorporated herein by reference. The Agrawal patent discloses and claims a placement method for the design of integrated circuits in which the steps of the method are optimized by a formal timing driven hierarchy. While this patent addresses the need in the art somewhat, it does not adequately address effects created by the presence of capacitive elements and resistive-capacitive (RC) delays. The resistive and capacitive effects are inherent in the wiring between components and in the numerous semiconductor junctions in the circuit. Capacitive elements affect the design of the circuit by adding an element of delay. This delay limits the operational speed and therefore performance of the system.

As such factors should be taken into account during the placement process, a need remains in the art for an effective system and technique for addressing resistive and capacitive effects and delays in the placement design of integrated circuits.

SUMMARY OF THE INVENTION

The need in the art is addressed by the present invention which provides a timing driven placement system and method for designing an integrated circuit. The inventive method includes the steps of identifying a plurality of nets having blocks of circuit components connected by conductive elements; assigning weights to the nets in proportion to timing and resistive-capacitive (RC) effects therein; and selecting locations for the circuit components to minimize the length of the wires therebetween in accordance with the weights.

In a particular implementation, the assignment of weights is effected by calculating a worst case resistive-capacitive delay (Net_RC) of a sink pin of a net under consideration, setting a minimum resistive-capacitive delay threshold (Min_RC_Design) associated with the pin of the net, subtracting the minimum resistive-capacitive delay threshold (Min_RC_Design) from the worst case resistive-capacitive delay (Net_RC) of the sink pin of the net under consideration to acquire a first difference term (Net_RC-Min_RC_Design), setting an upper limit for resistive-capacitive delay of the net (UPPER_RC), subtracting the minimum resistive-capacitive delay threshold from the upper limit (UPPER_RC) to acquire a second difference term (UPPER_RC-Min_RC_Design), dividing the first difference term by the second difference term to acquire a first ratio (Net_RC-Min_RC_Design)/(UPPER_RC-Min_RC_Design), setting a relative percentage weight (FRAC_RC) to assign to RC delay values versus SLACK values representing a difference between a measured arrival time of a logical result and an expected arrival time of the result for the net under consideration, multiplying the first ratio by the relative percentage weight (FRAC_RC) times 100 to acquire a first sum term, determining a maximum or worst SLACK of the net under consideration (Net SLACK) and subtracting the Net SLACK from the UPPER_SLACK to acquire a third difference term, determining the minimum SLACK associated with any net within the circuit (Min_SLACK_Design), subtracting the minimum SLACK associated with any net from the UPPER_SLACK to acquire a fourth difference term, dividing the third difference term by the fourth difference term to acquire a second ratio, multiplying the second ratio by (1-FRAC_RC)*100 to acquire a second sum term, adding the first and the second sum terms, and adding a constant to the first and the second sum terms to acquire a weight for the net.

In the preferred embodiment, the weights are used by a conventional placement program such as CPLACE to obtain the final placements. The method may be implemented in a computer program as a preprocessing step in a conventional computing system running CPLACE or other compatible program.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof.

The inventive method allows for standard cell placement algorithms such as CPLACE by IBM and Cell3 by Cadence Design Systems to take RC and timing issues into account during the placement process. The inventive program generates a set of weights which are used by the conventional placement program during the placement process. CPLACE, for example, treats every net within a design with a default net weight of 10. A net weight of 100 within the placement program then effectively causes a net to be treated as if it were 10 nets instead of 1. This increase in net weighting causes CPLACE to give more consideration to a net weight of 100 than to a net weight of 10 during the placement process. The placement program will strive to minimize the overall wire length within a given design. Hence, a net weight of 100 will cause a net to have a shorter route than a net weight of 10 which is better from the standpoint of capacitive effects, RC delays and timing issues.

The present invention achieves timing driven placement through the use of net weighting. By increasing the net weights of critical nets and/or nets with large RC delays, it is possible to arrive at placements that are better for timing without sacrificing the wireability of the design itself.

Figure 1:
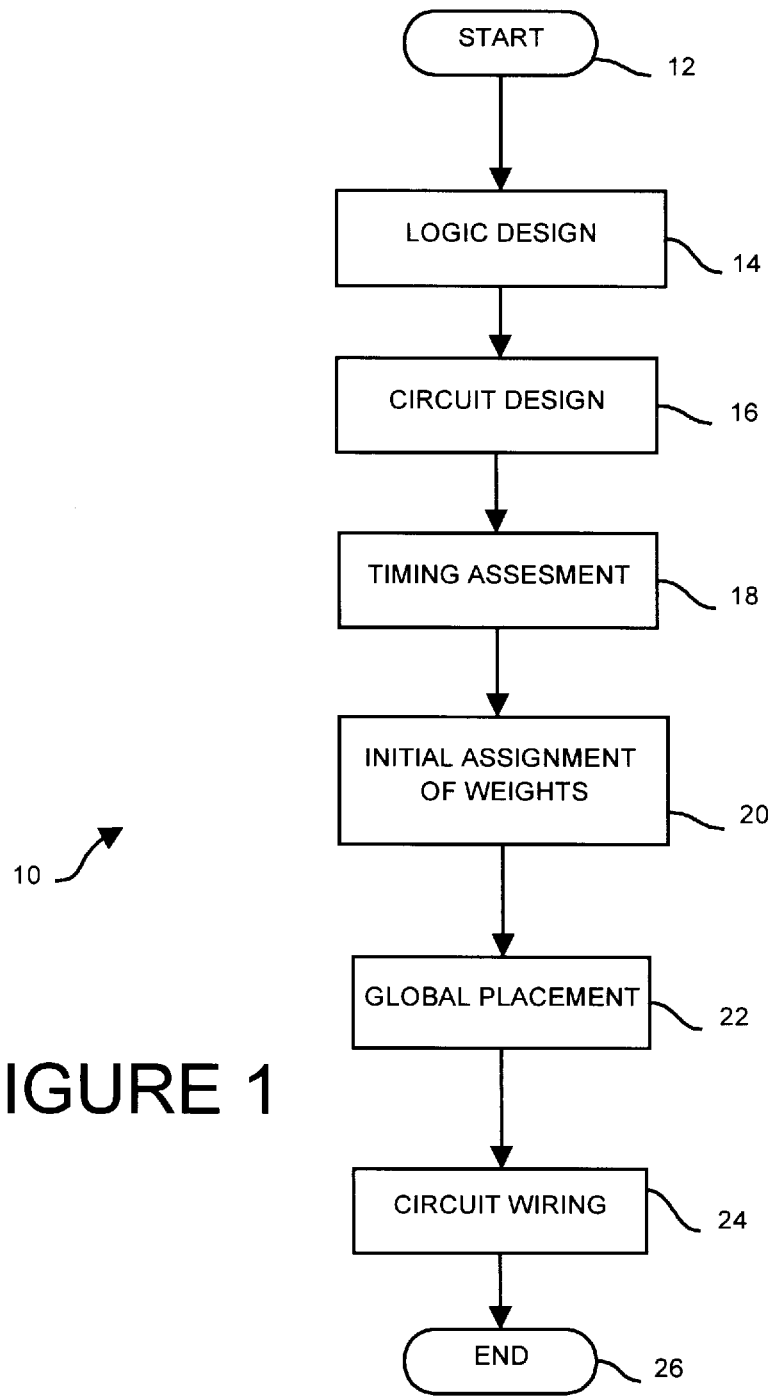
FIG. 1 is a flow diagram of an illustrative implementation of an integrated circuit design method in accordance with the teachings of the present invention.

FIG. 1 is a flow diagram of an illustrative implementation of an integrated circuit design method in accordance with the teachings of the present invention. The method 10 may be implemented in a computer aided design (CAD) system (not shown). First, the logical design of the circuit is set in a conventional manner (step 14). Next, a circuit is designed which fulfills the requirements of the logical design (step 16). At step 18, an initial timing assessment is completed. Next, at step 20, a set of weights are provided which take timing and resistive-capacitive (RC) effects into account for the nets of the circuit in accordance with the present teachings. The weights are then used by a conventional global placement program such as CPLACE to minimize the length of the electrical connections between the components of the circuit (step 22). Finally, at step 24, the circuit is wired in accordance with the placements determined at step 22.

Figure 2:
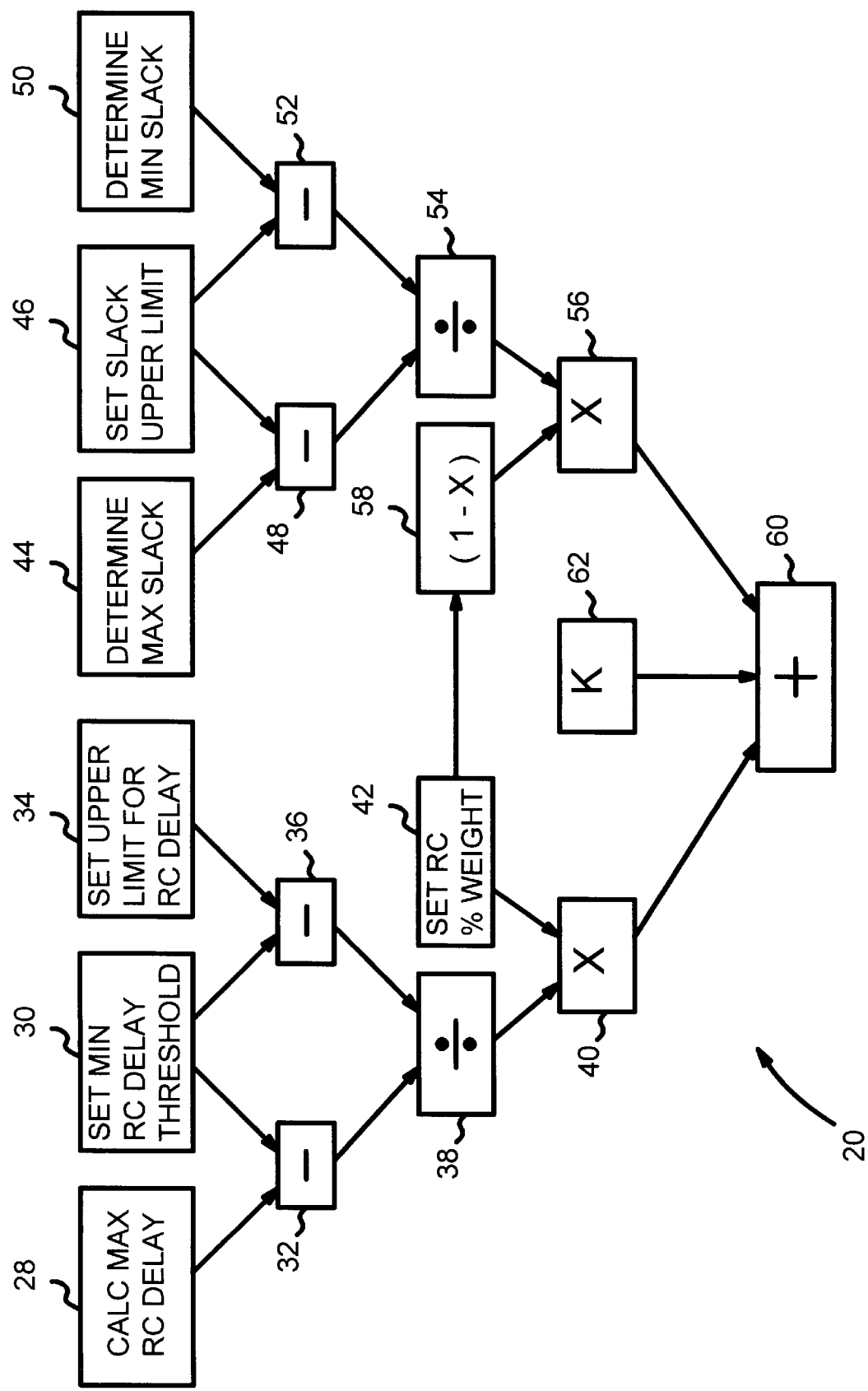
FIG. 2 is a flow diagram of the method of assigning initial resistive-capacitive and timing driven net weights in accordance with the teachings of the present invention.

FIG. 2 is a flow diagram of the method of assigning initial resistive-capacitive and timing driven net weights in accordance with the teachings of the present invention. Each net is considered individually. If the maximum SLACK of the net under consideration is greater than a user defined upper limit on SLACK, then, at step 20, weights are generated for all nets that are timing critical. ('SLACK' is a term of art which represents a difference between a measured arrival time of a logical result and an expected arrival time of the result for the net under consideration.)

In accordance with the inventive method, at step 28, a worst case resistive-capacitive delay of a sink pin of a net under consideration is calculated using a conventional timing tool. At step 30, a minimum resistive-capacitive delay threshold for the pin of the net is set. At step 32, the minimum resistive-capacitive delay threshold is subtracted from the worst case resistive-capacitive delay of the sink pin of the net under consideration to acquire a first difference term. Next, at step 34, an upper limit for resistive-capacitive delay of the net is set. At step 36, minimum resistive-capacitive delay threshold is subtracted from the upper limit for the RC delay of the net to acquire a second difference term. The first difference term is divided by the second difference term at step 38 to acquire a first ratio. At step 40, the first ratio is multiplied by a relative percentage weight assigned at step 42 to RC delay values versus SLACK values. At step 40, the first ratio is multiplied by the relative percentage RC weight times 100 to acquire a first sum term.

To adjust the weight for SLACK, at step 44, the maximum or worst SLACK of the net under consideration is input. At step 46, an upper limit on SLACK is input. At step 48, the maximum SLACK is subtracted from the upper limit on SLACK to acquire a third difference term. At step 50, the minimum SLACK associated with any net within the circuit is determined. At step 52, the minimum SLACK associated with any net in the circuit is subtracted from the upper limit on SLACK to acquire a fourth difference term. At step 54, the third difference term is divided by the fourth difference term to acquire a second ratio. At step 56, the second ratio is multiplied by (1—the relative percentage RC weight) times 100 to acquire a second sum term. At step 60, the first and the second sum terms are added to a constant (e.g., 10) to acquire the initial weight for the net under consideration.

Hence, the timing and RC driven placement method of the invention is as follows:

```
If (Net_Slack > UPPER_SLACK), then:
    Net_wt = 10.0 + ((Net_RC – Min_RC_Design)/
(UPPER_RC – Min_RC_Design)
            *FRAC_RC*100) + (UPPER_SLACK – Net_Slack)/
            (UPPER_SLACK
            Min_SLACK_Design)*(1–FRAC_RC)*100);
Else Net_wt = 10.0;
``` where:

Net Slack=the maximum or worst slack of the net under consideration;

UPPER_SLACK=a user specified parameter setting an upper limit on the largest SLACK permitted;

Net_RC=the worst RC delay associated with a sink pin of the net under consideration;

Min_RC_Design=the minimum RC delay associated with any input pin within the design;

UPPER_RC=a user specified parameter setting an upper limit on the largest RC delay permitted;

FRAC_RC=the relative percentage weight to assign to RC values versus SLACK values; and Min_SLACK_Design=the minimum SLACK associated with any net within the design.

For a typical design,

FRAC_RC=0.5, (specified by user)

UPPER_RC=0.6,

UPPER_SLACK=0.5,

Min_RC_Design=0, (determined from design itself)

Min_SLACK_Design=8.0.

Note that only those nets that are greater than the UPPER_SLACK parameter specified by the user are weighted by the inventive method. For an UPPER_SLACK value of 0.0, only critical nets (i.e., nets that do not meet the cycle time constraints) would be weighted.

The inventive method attempts to uniformly scale the weight of a net based on the Net_RC and Net_Slack values of a net. The Net_RC is normalized to the spread of the RCs within the design. UPPER_RC is used in place of Max_RC_Design due to unknown RC effects being expressed as large positive values. Similarly, the Net_Slack is normalized to the delta of the slack within the design. UPPER_SLACK is used in place of Max_Slack_Design due to don't cares being expressed as large positive values.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

What is claimed is:

1. A method for designing an integrated circuit including the steps of:

identifying a plurality of nets having blocks of circuit components connected by conductive elements;

assigning weights to the plurality of nets in proportion to a combination of timing and resistive-capacitive (RC) effects therein, the step of assigning weights including the steps of:

calculating a worst case resistive-capacitive delay (Net_RC) of a sink pin of a net under consideration, setting a minimum resistive-capacitive delay threshold (Min_RC_Design) associated with the pin of the net under consideration, subtracting the minimum resistive-capacitive delay threshold (Min_RC_Design) from the worst case resistive-capacitive delay (Net_RC) of a sink pin of the net under consideration to acquire a first difference term (Net_RC–Min_RC_Design), setting an upper limit for resistive-capacitive delay of the net (UPPER_RC), subtracting the minimum resistive-capacitive delay threshold from the upper limit (UPPER_RC) to acquire a second difference term (UPPER_RC–Min_RC_Design), dividing the first difference term by the second difference term to acquire a first ratio (Net_RC–Min_RC_Design)/(UPPER_RC–Min_RC_Design), setting a relative percentage weight (FRAC_RC) to assign to RC delay values versus SLACK values representing a difference between a measured arrival time of a logical result and an expected arrival time of the result for the net under consideration, multiplying the first ratio by the relative percentage weight (FRAC_RC) times 100 to acquire a first sum term, determining a maximum or worst SLACK of the net under consideration (Net SLACK), setting an upper limit on SLACK (UPPER_SLACK), subtracting the Net SLACK from the UPPER_SLACK to acquire a third difference term, determining the minimum SLACK associated with any net within the circuit (Min_SLACK_Design), subtracting the minimum SLACK associated with any net from the UPPER_SLACK to acquire a fourth difference term, dividing the third difference term by the fourth difference term to acquire a second ratio, multiplying the second ratio by (1-FRAC_RC) times 100 to acquire a second sum term, adding the first and the second sum terms, and adding a constant to the first and the second sum terms to acquire a weight for the net; and selecting locations for the circuit components to reduce the length of a plurality of wires therebetween in accordance with the weights, the step of selecting locations for the circuit components including the step of running a placement program using the weight for the net.

2. The method of claim 1 wherein the step of calculating a worst case RC delay of a sink pin of a net under consideration is performed with a timing tool.

3. A system for designing an integrated circuit having a plurality of nets comprising blocks of circuit components connected by conductive elements, the system including:

a processor and a first program executed by the processor for assigning weights to the plurality of nets in proportion to a sum of timing and resistive-capacitive (RC) effects therein, the first program including instructions for:

calculating a worst case resistive-capacitive delay (Net_RC) of a sink pin of a net under consideration, setting a minimum resistive-capacitive delay threshold (Min_RC_Design) associated with the pin of the net, subtracting the minimum resistive-capacitive delay threshold (Min_RC_Design) from the worst case resistive-capacitive delay (Net_RC) of a sink pin of a net under consideration to acquire a first difference term (Net_RC−Min_RC_Design), setting an upper limit for resistive-capacitive delay of the net (UPPER_RC), subtracting the minimum resistive-capacitive delay threshold from the upper limit (UPPER_RC) to acquire a second difference term (UPPER_RC−Min_RC_Design), dividing the first difference term by the second difference term to acquire a first ratio (Net_RC−Min_RC_Design)/(UPPER_RC−Min_RC_Design), setting a relative percentage weight (FRAC_RC) to assign to RC delay values versus SLACK values representing a difference between a measured arrival time of a logical result and an expected arrival time of the result for the net under consideration, multiplying the first ratio by the relative percentage weight (FRAC_RC) times 100 to acquire a first sum term, determining a maximum or worst SLACK of the net under consideration (Net SLACK) and subtracting the Net SLACK from the UPPER_SLACK to acquire a third difference term, determining the minimum SLACK associated with any net within the circuit (Min_SLACK_Design), subtracting the minimum SLACK associated with any net from the UPPER_SLACK to acquire a fourth difference term, dividing the third difference term by the fourth difference term to acquire a second ratio, multiplying the second ratio by (1-FRAC_RC) times 100 to acquire a second sum term, adding the first and the second sum terms, and adding a constant to the first and the second sum terms to acquire a weight for the net.

4. The system of claim 3 including a second program for selecting locations for the circuit components to reduce the length of a plurality of wires therebetween in accordance with the weights.

5. A computer-readable medium containing a program for designing an integrated circuit, the program containing instructions for:

selecting a plurality of nets having blocks of circuit components and assigning weights to the plurality of nets in proportion to a sum of timing and resistive-capacitive (RC) effects therein, the instruction for assigning weights to the plurality of nets further including the instructions for:

calculating a worst case resistive-capacitive delay (Net_RC) of a sink pin of a net under consideration, setting a minimum resistive-capacitive delay threshold (Min_RC_Design) associated with the pin of the net, subtracting the minimum resistive-capacitive delay threshold (Min_RC_Design) from the worst case resistive-capacitive delay (Net_RC) of a sink pin of a net under consideration to acquire a first difference term (Net_RC−Min_RC_Design), setting an upper limit for resistive-capacitive delay of the net (UPPER_RC), subtracting the minimum resistive-capacitive delay threshold from the upper limit (UPPER_RC) to acquire a second difference term (UPPER_RC−Min_RC_Design), dividing the first difference term by the second difference term to acquire a first ratio (Net_RC−Min_RC_Design)/(UPPER_RC−Min_RC_Design), setting a relative percentage weight (FRAC_RC) to assign to RC delay values versus SLACK values representing a difference between a measured arrival time of a logical result and an expected arrival time of the result for the net under consideration, multiplying the first ratio by the relative percentage weight (FRAC_RC) times 100 to acquire a first sum term, determining a maximum or worst SLACK of the net under consideration (Net SLACK) and subtracting the Net SLACK from the UPPER_SLACK to acquire a third difference term, determining the minimum SLACK associated with any net within the circuit (Min_SLACK_Design), subtracting the minimum SLACK associated with any net from the UPPER_SLACK to acquire a fourth difference term, dividing the third difference term by the fourth difference term to acquire a second ratio, multiplying the second ratio by (1-FRAC_RC) times 100 to acquire a second sum term, adding the first and the second sum terms, and adding a constant to the first and the second sum terms to acquire a weight for the net.

\* \* \* \* \*